(12) United States Patent
Hsieh et al.

(10) Patent No.: US 8,796,723 B2
(45) Date of Patent: Aug. 5, 2014

(54) LIGHT-EMITTING DEVICE

(71) Applicant: Epistar Corporation, Hsinchu (TW)

(72) Inventors: Min-Hsun Hsieh, Hsinchu (TW);
Chien-Yuan Wang, Hsinchu (TW);
Tsung-Xian Lee, Hsinchu (TW);
Chih-Ming Wang, Hsinchu (TW);
Ming-Chi Hsu, Hsinchu (TW);
Han-Min Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/047,778

(22) Filed: Oct. 7, 2013

(65) Prior Publication Data

US 2014/0034988 A1      Feb. 6, 2014

Related U.S. Application Data

(62) Division of application No. 13/306,487, filed on Nov. 29, 2011, now Pat. No. 8,552,454.

(30) Foreign Application Priority Data

Nov. 29, 2010   (TW) .............................. 099141373 A
Nov. 29, 2010   (TW) .............................. 099141375 A

(51) Int. Cl.
*H01L 33/00*   (2010.01)

(52) U.S. Cl.
USPC ................... 257/98; 257/88; 257/89; 257/99; 257/E21.592; 313/112; 313/501; 313/503; 313/506

(58) Field of Classification Search
USPC ............. 257/12–13, 81, 84, 888–89, 98–100, 257/347–348, 433–434; 438/22, 25–27, 29, 438/47–52; 313/112, 501, 503, 506–507
See application file for complete search history.

(56) References Cited

U.S. PATENT DOCUMENTS

2009/0295265 A1 *  12/2009  Tabuchi et al. ................ 313/112

FOREIGN PATENT DOCUMENTS

| CN | 101443924 A | 5/2009 |
| JP | 2007-036199 A | 2/2007 |
| JP | 2008-192909 A | 8/2008 |

* cited by examiner

*Primary Examiner* — Dung A. Le
(74) *Attorney, Agent, or Firm* — Ditthavong & Steiner, P.C.

(57) ABSTRACT

Disclosed is a light-emitting device comprising: a carrier; a light-emitting element disposed on the carrier; a first light guide layer covering the light-emitting element; a second light guide layer covering the first light guide layer; a low refractive index layer between the first light guide layer and the second light guide layer to reflect the light from the second light guide layer; and a wavelength conversion layer covering the second light guide layer; wherein the low refractive index layer has a refractive index smaller than one of the refractive indices of first light guide layer and the second light guide layer.

18 Claims, 14 Drawing Sheets

LIGHT-EMITTING DEVICE

REFERENCE TO RELATED APPLICATION

This application is a division of U.S. patent application Ser. No. 13/306,487, entitled "LIGHT-EMITTING DEVICE AND LIGHT MIXING DEVICE, filed on Nov. 29, 2011, now pending, which claims the right of priority based on Taiwan patent application Ser. No. 099141373, filed on Nov. 29, 2010, and Taiwan patent application No. 099141375, filed on Nov. 29, 2010, the entirety of which is incorporated by reference herein.

TECHNICAL FIELD

The application relates to a method to form a light-emitting device, and in particular to a method to form a light-emitting device with a high light extraction efficiency.

DESCRIPTION OF BACKGROUND ART

In recent years, because of the increasing attention to energy issue, many new energy-efficient lighting tools are developed. Among them, the light-emitting diode (LED) has features such as high luminous efficiency, less power consumption, mercury-free and long life time, and becomes a very promising lighting tool for the next generation.

For the white light LED for lighting, there are many references discussing different producing methods. One method is to use the LED chip and phosphor powder. For example, blue light emitted from a blue LED chip is used to excite YAG (Yttrium Aluminum Garnet, $Y_3Al_5O_{12}$) phosphor to emit yellow light, and a mixture of both the blue and yellow lights forms white light.

There are two common methods for phosphor coating, one is conformal coating method, and the other one is the remote phosphor method. As shown in FIG. 1, the conformal coating is to coat the phosphor 103 directly on each LED chip 102. Because the phosphor is coated directly on the LED chip 102, the thickness is much uniform. However, because the light from the phosphor is absorbed by the LED chip 102 and the carrier 101, the overall luminous efficiency is reduced. In addition, because the phosphor 103 is in direct contact with the LED chip 102, when the LED chip 102 operates to result in a high temperature environment of 100° C. to 150° C., the phosphor layer deteriorates gradually, and the luminous efficiency is affected.

The remote phosphor solves the problem of the conformal coating. FIG. 2 shows a light-emitting device of an LED chip with remote phosphor. The light-emitting device 20 comprises a carrier 201, an LED chip 202, a hemispheric package resin 204, and the phosphor layer 203 coated thereon. As shown in FIG. 2, as the phosphor layer 203 is separated from the LED chip 202, the problem that light from the phosphor layer 203 is absorbed directly by the LED chip 102 is avoided. And because the phosphor layer 203 is disposed away from the LED chip 202, it is more difficult for phosphor powders in the phosphor layer 203 to deteriorate due to the high temperature environment when the LED chip 202 operates.

However, the luminous efficiency is usually affected by the resin in the remote phosphor structure. FIG. 3A shows the propagating path of light after being emitted from the LED chip. According to Snell's law, as the refractive index (denoted by n) of the LED chip 302 is 2.4, and the refractive index n of the package resin 304 is 1.5, when light from the LED chip is incident to the surface of the package resin 304 with an angle less than the critical angle $\theta_c$, like the condition shown by path A, the light is refracted and enters into the package resin 304. But when light from the LED chip is incident to the surface of the package resin 304 with an angle larger than the critical angle $\theta_c$, like the condition shown by path B, the light is totally and internally reflected in the LED chip (Total Internal Reflection, TIR) and is absorbed by the LED chip 302. Therefore, when the refractive index difference between the LED chip and the package materials outside the LED chip is too large, the luminous efficiency of the LED chip is greatly affected.

In addition, there is the scattering effect of the particles of phosphors powder as shown in FIG. 3B. The phosphor powder particles 303a are excited to emit light of a different color by the light from the LED chip. However, the light emitted from the phosphor particles 303a propagates in all directions, and therefore, part of the light from phosphor powder particles 303a is incident toward the surface of the resin package 304. This results in inward-propagating light rather than outward-propagating light, and thus the luminous efficiency is reduced.

SUMMARY OF THE DISCLOSURE

Disclosed is a light-emitting device comprising: a carrier; a light-emitting element disposed on the carrier; a first light guide layer covering the light-emitting element; a second light guide layer covering the first light guide layer; a low refractive index layer between the first light guide layer and the second light guide layer to reflect the light from the second light guide layer; and a wavelength conversion layer covering the second light guide layer; wherein the low refractive index layer has a refractive index smaller than one of the refractive indices of first light guide layer and the second light guide layer.

DETAILED DESCRIPTION OF PREFERRED EMBODIMENTS

The application is illustrated as following with the schematic figures. The embodiments are demonstrated to make a person of ordinary skill in the art understand the spirit of the present application. The present application is not limited to the shown embodiments, but can be alternated by following the spirit of the application. The width, length, thickness and other similar dimension is enlarged to facilitate the illustration, if necessary. For all the figures, elements denoted by the same element symbols are the same elements.

It is particularly noted that when the specification describes a component or a layer of material is disposed on or connected to another component or another layer of material, it may be the either the case that the component or the layer of material is directly disposed on or connect to another component or another layer of material, or the case that the component or the layer of material is indirectly disposed on or connected to another component or another layer of material, that is, still another component or still another layer of material is between them. To the contrary, when the specification describes a component or a layer of material is directly disposed on or connected to another component or another layer of material, no component or layer of material is between them.

[First Embodiment]

Figure 1:
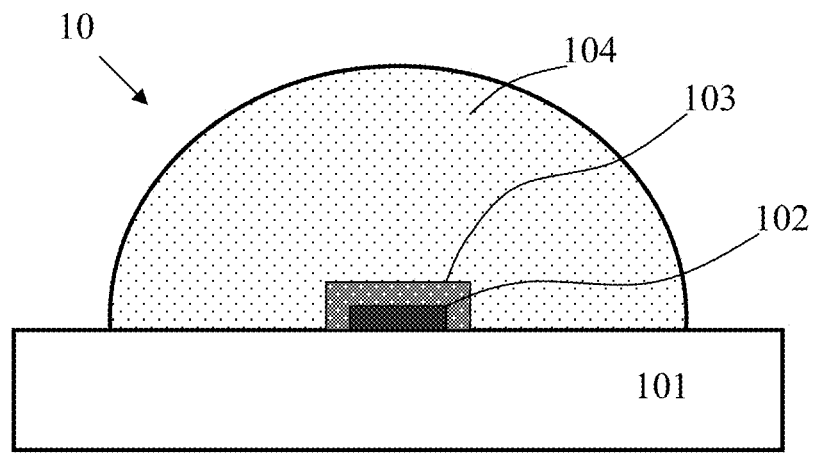
FIG. 1 illustrates a white light light-emitting device using the conformal phosphor coating method known in the prior art.
Figure 2:
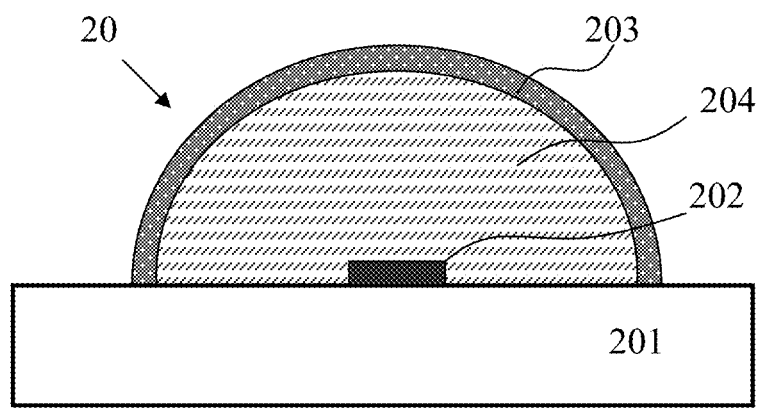
FIG. 2 illustrates a white light light-emitting device using the remote phosphor method known in the prior art.
Figure 3A:
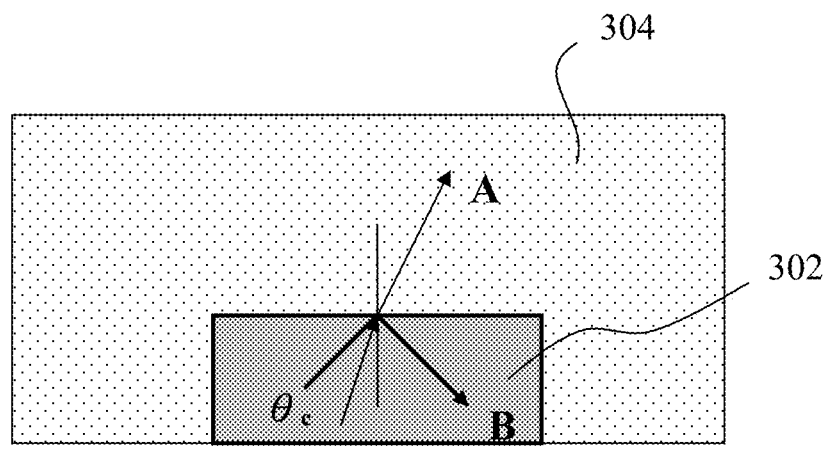
FIG. 3A illustrates the propagating path of light after being emitted from the LED chip.
Figure 3B:
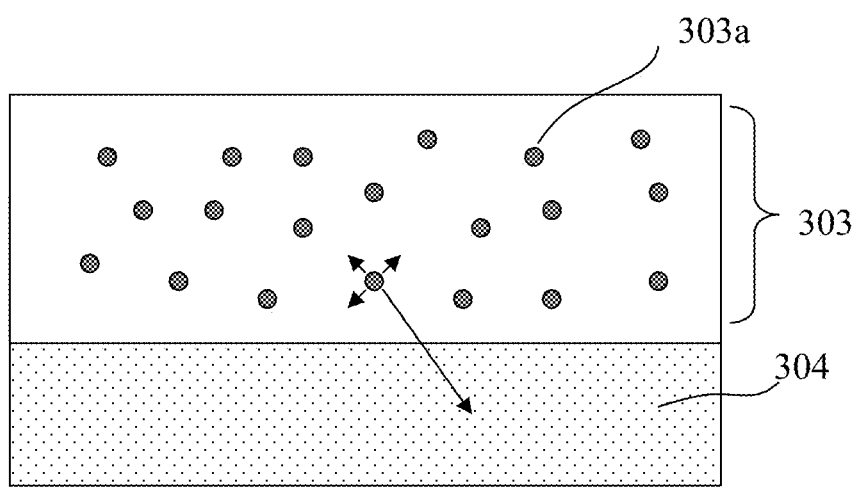
FIG. 3B illustrates the scattering effect of the particles of phosphors powders.
Figure 4:
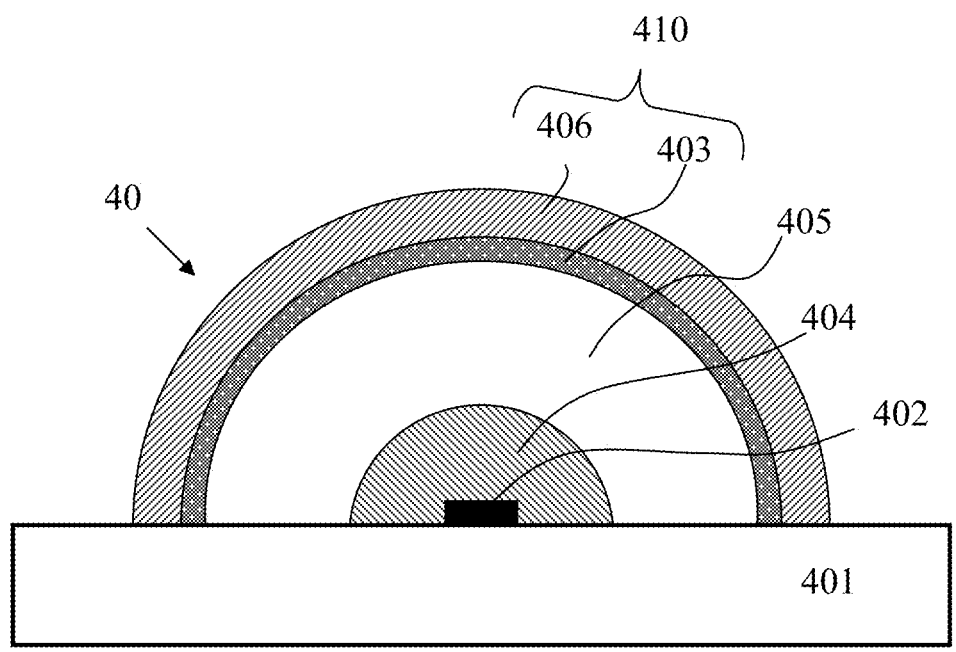
FIG. 4 illustrates the light-emitting device in accordance with the first embodiment of the present application.

FIG. 4 shows the light-emitting device 40 of the first embodiment of the present application. The light-emitting device 40 comprises a carrier 401 and a light-emitting element 402 disposed on the carrier 401. The light-emitting device 40 further comprises a first light guide layer 404 covering the light-emitting element 402 and is disposed on the carrier 401. The light-emitting device 40 further comprises a wavelength conversion and light guide layer 410. The wavelength conversion and light guide layer 410 comprises a second light guide layer 406 and a wavelength conversion layer 403.

Figure 5A:
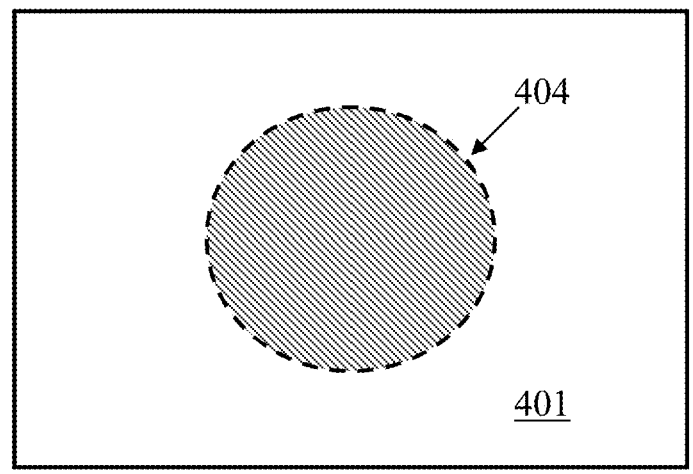
FIG. 5A illustrates the projection of the first light guide layer on the carrier in accordance with the first embodiment of the present application.
Figure 5B:
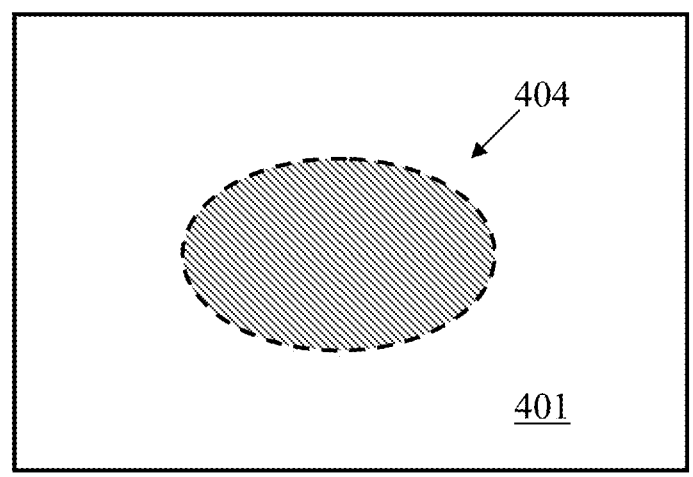
FIG. 5B illustrates another projection of the first light guide layer on the carrier in accordance with the first embodiment of the present application.

As shown in FIG. 4, the first light guide layer 404 is, for example, a dome shape structure. Specifically, the first light guide layer 404 is a hemisphere shape structure. Please refer to FIG. 5A and FIG. 5B, the first light guide layer 404 is not limited to the hemispherical structure, and its projection on the surface of carrier 401 may be a circular or an oval. In addition to the dome shape structure, in other embodiments, the first light guide layer 404 may also be a structure of other shapes.

The second light guide layer 406 is disposed on the carrier 401, and covers the first light guide layer 404 and the light-emitting element 402. In addition, a low refractive index layer 405 is disposed between the wavelength conversion layer 403 and the first light guide layer 404. The second light guide layer 406 is, for example, a dome shape structure. Specifically, the second light guide layer 406 is a hemisphere shape structure. As the first light guide layer 404 shown in FIG. 5A and FIG. 5B, the second light guide layer 406 is not limited to the hemispherical structure, and the projection of the second light guide layer 406 on the surface of the carrier 401 may be a circular or an oval. In addition to the dome shape structure illustrated in this embodiment, in other embodiments, the second light guide layer 406 may also be a structure of other shapes.

In this embodiment, the diameter (or longer diameter of the oval) of the projection of the first light guide layer 404 on the surface of the carrier 401 is preferred to be greater than or equal to 2.5 times of the length of the light-emitting element 402, and the light-emitting element 402 is disposed in the center of the shape of the projection of the first light guide layer 404 on the surface of the carrier 401. Therefore, the reflection of light occurring on the surface of the first light guide layer 404 can be reduced, and the light is radiated out. The diameter (or longer diameter of the oval) of the projection of the second light guide layer 406 on the surface of the carrier 401 is preferred to be greater than or equal to 2 times of the diameter (or longer diameter of the oval) of the projection of the first light guide layer 404 on the surface of the carrier 401. Therefore, the reflection of light occurring on the surface of the second light guide layer 406 can be reduced.

In this embodiment, the carrier 401 may be a carrier for package, or when the light-emitting element 402 and a carrier for package are to be formed as a light-emitting module, the carrier 401 may be a printed circuit board, and the light-emitting element 402 may be a blue GaN LED chip. Although a blue LED chip is used in this embodiment, an LED chip that emits other color may be used if necessary. In addition, the light-emitting element 402 is not limited to be only one LED chip, but may be a plurality of LED chips. The plurality of LED chips may be LED chips of different colors, for example, a blue LED chip and a red LED chip, or may be LED chips of same color, for example, a blue LED chip and another blue LED chip.

Figure 6:
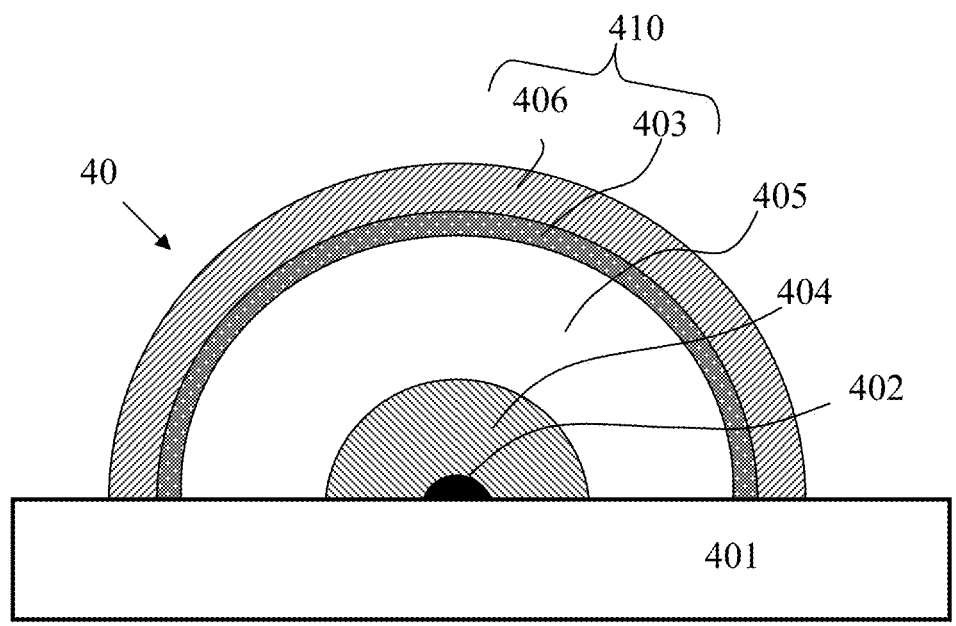
FIG. 6 illustrates the modified light-emitting device in accordance with the first embodiment of the present application.

FIG. 6 shows a light-emitting device of the first embodiment of the present application. As shown in the figure, the shape of the light-emitting element 402 is not limited to a common shape as a cube, but may be a hemisphere shape. Here, the light-emitting element 402 may be replaced by other types of light-emitting devices, for example, an organic light-emitting diode (OLED). That is, the blue GaN LED chip may be replaced by the blue OLED.

Figure 7:
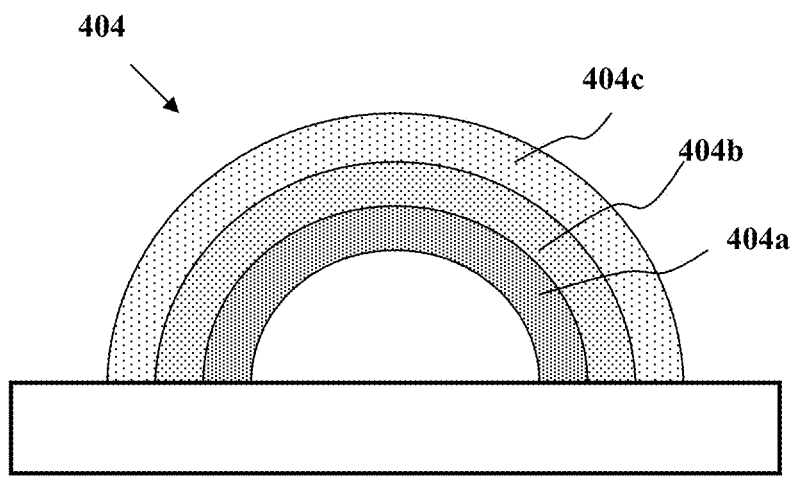
FIG. 7 illustrates the first light guide layer in accordance with the first embodiment of the present application.

FIG. 7 shows the schematic drawing of the first light guide layer 404 in this embodiment. The first light guide layer 404 is a layer of material that enhances the light extraction efficiency. In more details, after the first light guide layer 404 is disposed on the light-emitting element 402, the light extraction efficiency is better than the one when the light-emitting element 402 is in direct contact with the air. In this embodiment, the first light guide layer 404 comprises a plurality of layers of material, and has a gradient refractive index (GRIN). As shown in the figure, the first light guide layer 404 comprises a first refractive index layer 404a, a second refractive index layer 404b, and a third refractive index layer 404c. Wherein, the first refractive index layer 404a comprises a refractive index $n_a$, the second refractive index layer 404b comprises a refractive index $n_b$, and the third refractive index layer 404c comprises a refractive index $n_c$, wherein $n_a > n_b > n_c$.

In this embodiment, the first refractive index layer 404a is silicon nitride ($Si_3N_4$), and the refractive index $n_a$ is 1.95. The second refractive index layer 404b is silicon oxynitride (SiON) or aluminum oxide ($Al_2O_3$), and the refractive index $n_b$ is 1.7. The third refractive index layer 404c is silicone, and the refractive index $n_c$ is 1.45. Although the first light guide layer 404 comprises silicon nitride, silicon oxynitride, and silicone in this embodiment, other materials may be used in other embodiments. For example, other materials may be glass (the refractive index is 1.5 to 1.9), resin (the refractive index is 1.5 to 1.6), diamond like carbon (DLC, the refractive index is 2.0 to 2.4), titanium oxide ($TiO_2$, the refraction index is 2.2 to 2.4), silicon oxide ($SiO_2$, the refractive index is 1.5 to 1.7) or magnesium fluoride (MgF, the refractive index is 1.38). In this embodiment, the refractive index of the blue GaN LED chip is 2.4. When the refractive index of the first refractive index layer 404a of the first light guide layer 404 is 1.95, the refractive index changes from 2.4 to 1.95 at the interface of the light-emitting element 402 and the first light guide layer 404, and therefore, the refractive index difference is small, the total reflection of light is reduced effectively.

Figure 8:
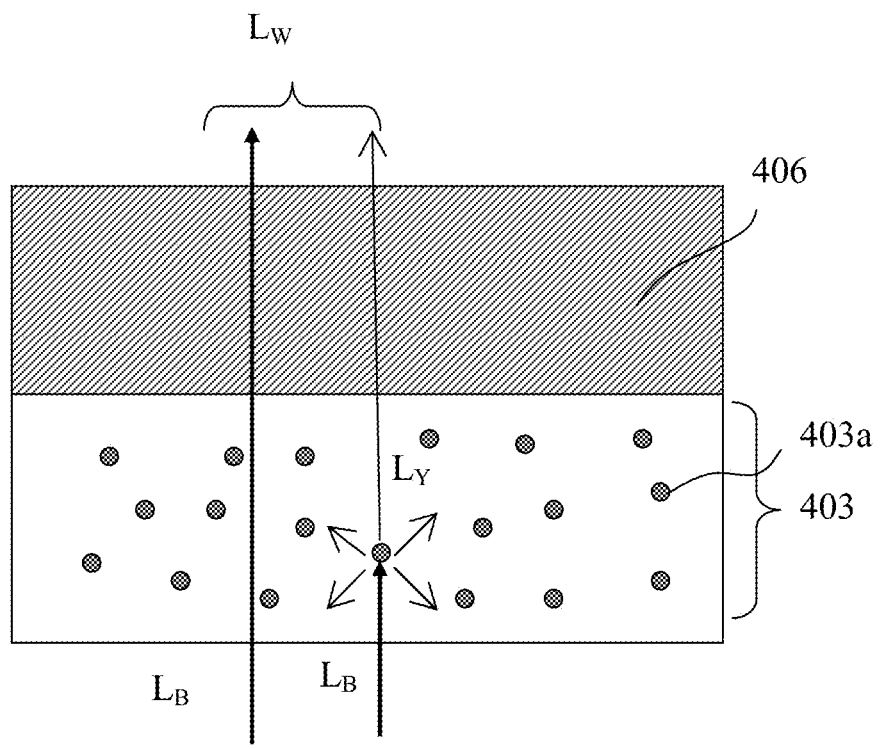
FIG. 8 illustrates the formation of white light in accordance with the first embodiment of the present application.

In addition, please refer to FIG. 4, in this embodiment, the outer side of the first light guide layer 404 of the light-emitting device 40 is the low refractive index layer 405. In this embodiment, the low refractive index layer 405 is a layer of air. The refractive index of the layer of air is n=1. Thus, the refractive index changes from 1.45 to 1.0 at the interface of the first light guide layer 404 and the low refractive index layer 405, and the total reflection of light caused by the large difference in refractive index is also reduced effectively. In addition, the wavelength conversion layer 403 is a material to converse the wavelength of incident light in this embodiment, such as phosphor. In this embodiment, the wavelength conversion layer 403 is a yellow phosphor layer. Please refer to FIG. 8, blue light $L_B$ emitted from the blue GaN LED chip (not shown in the figure) propagates through the first light guide layer (not shown in the figure) and the low refractive index layer (not shown in figure) and is incident to the wavelength conversion layer 403, it excites the phosphor powder particles 403a, such as YAG or TAG, of the yellow phosphor layer, and yellow light $L_Y$ is emitted. The mixture of blue light $L_B$ emitted from the blue GaN LED chip and yellow light $L_Y$ emitted from the yellow phosphor layer form white light $L_W$. As the combination of the first light guide layer 404, the low refractive index layer 405, and the wavelength conversion and light guide layer 410 also has a function of light mixing, the combination of the three structures can be deemed as a light mixing device. The light mixing device may further comprise the carrier 401 on which the light-emitting element 402 is disposed.

In this embodiment, the wavelength conversion layer 403 is formed on the inner side of the second light guide layer 406. The second light guide layer 406 is a layer of material which enhances the light extraction efficiency. In more details, after the second light guide layer 406 is disposed on the light-emitting element 402, the light extraction efficiency is better than the one when the light-emitting element 402 is in direct contact with the air. In this embodiment, the second light guide layer 406 comprises a plurality of layers of material, and has a gradient refractive index (GRIN). Specifically, the second light guide layer 406 has a fourth refractive index layer and a fifth refractive index layer (not shown in the figure). The fourth refractive index layer is silicon oxynitride (SiON), and the refractive index is 1.7. The fifth refractive index layer is silicone, and the refractive index is 1.45. Although silicon oxynitride layer and silicone layer are used for the second light guide layer 406 in this embodiment, other materials may be used in other embodiments. For example, other materials may be glass (the refractive index is 1.5 to 1.9), resin (the refractive index is 1.5 to 1.6), diamond like carbon (DLC, the refractive index is 2.0 to 2.4), titanium oxide ($TiO_2$, the refraction index is 2.2 to 2.4), silicon oxide ($SiO_2$, the refractive index is 1.5 to 1.7) or magnesium fluoride (MgF, the refractive index is 1.38). In addition, in other embodiments, the second light guide layer 406 may be a lens with a function to converge light, or a layer of material with a refractive index between the ones of a wavelength conversion layer 403 and the low refractive index layer 405, such as resin or glass. In this embodiment, the refractive index of the yellow phosphor layer is 1.8. The refractive index changes from 1.8 to 1.7 at the interface of the wavelength conversion layer 403 and the second light guide layer 406, and therefore the total reflection of light caused by large refractive index difference is reduced.

The low refractive index layer 405 is for reflecting light from the wavelength conversion and light guide layer 410. Here, the term of "reflecting" means that when the light from the wavelength conversion and light guide layer 410 is incident on the interface of the low refractive index layer 405, the proportion of the light that is totally and internally reflected (Total Internal Reflection, TIR) is greater than the proportion of the light that is refracted. As most of the light is totally and internally reflected rather than being refracted, the low refractive index layer 405 has a function for light reflection.

It is noted that the wavelength conversion layer 403 has a refractive index of n=1.8 in this embodiment, and the layer of air as a low refractive index layer 405 has a refractive index n=1. According to Snell's law, the critical angle is $\theta_c=\arcsin(n_1/n_2)$, wherein $n_1$ is the refractive index of the low light density medium, and $n_2$ is the refractive index of the high light density medium, so when the light propagates from the wavelength conversion layer 403 into the low refractive index layer 405, the critical angle is $\theta_c=\arcsin(1/1.8)=\arcsin(0.56)\approx 33°$. That is, when the angle of incidence of light >33°, the light is totally reflected.

Therefore, because of the existence of the low refractive index layer 405, when the yellow light from the wavelength conversion and light guide layer 410 or the light scattered by the phosphor powder particles is incident on the surface of the low refractive index layer 405, most of the light is totally and internally reflected (Total Internal Reflection, TIR) because of the low refractive index of the low refractive index layer 405.

The method to produce the light-emitting device 40 in the embodiment is illustrated as the following:

First, the light-emitting element 402 is formed on the carrier 401. The carrier 401 may be a carrier for package, or when the light-emitting element 402 and a carrier for package are to be formed as a light-emitting module, the carrier 401 may be a printed circuit board, and the light-emitting element 402 may be a blue GaN LED chip.

Then, a thin film is formed on the light-emitting element 402 by chemical vapor deposition method. The thin film is a stack formed subsequently to cover the light-emitting element 402 by a silicon nitride layer (not shown) and a silicon oxynitride layer (not shown). Another silicone layer (not shown) is coated on the silicon oxynitride layer. The silicone layer is then cured, and the stack of silicon nitride layer/silicon oxynitride layer/silicone layer is formed as the first light guide layer 404. In this embodiment, the method to form the silicon nitride layer is, for example, a chemical vapor deposition method with gases such as silane ($SiH_4$) and ammonia ($NH_3$) as the reactive gases. The method to form the oxynitride layer is, for example, a chemical vapor deposition method with gases such as silane ($SiH_4$) and nitrous oxide ($N_2O$) as the reactive gases. As the chemical vapor deposition method is known in this technical field, the details are not illustrated here.

In addition, a phosphor layer is coated on a hemispherical mold to be used as the wavelength conversion layer 403. The hemispherical mold is, for example, a hemispherical glass mold. The method to coat the phosphor layer is, for example, mixing a yellow phosphor powder uniformly with the glue, coating the mixture on the surface of the mold, and making the coating cured.

Then, an oxynitride silicone layer is formed on the surface of the phosphor layer by a chemical vapor deposition method, and a silicone layer is coated and cured to form a stack of a silicon oxynitride layer/a silicone layer as the second light guide layer 406. Then, the hemispherical mold is removed so the wavelength conversion and light guide layer 410 of the light-emitting device 40 is obtained in this embodiment.

Afterwards, the wavelength conversion and light guide layer 410 is adhered to the surface of the carrier 401 to cover the first light guide layer 404. The method to adhere the wavelength conversion and light guide layer 410 to the carrier 401 is, for example, applying an adhesive material to the rim of the second light guide layer 406 and then adhering the wavelength conversion and light guide layer 410 to the surface of the carrier 401. As the diameter of the projection of the second light guide layer 406 on the surface of the carrier 401 is greater than or equal to two times of the diameter of the projection of the first light guide layer 404 on the surface of the carrier 401, there is a layer of air between them. This layer of air can be the low refractive index layer 405.

[Second Embodiment]

Figure 9:
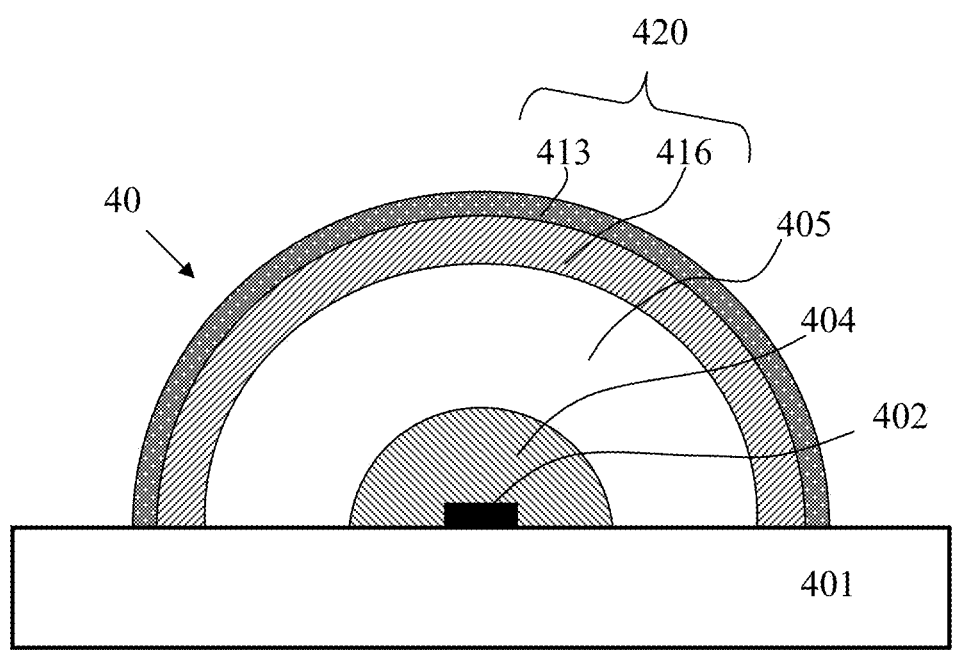
FIG. 9 illustrates the light-emitting device in accordance with the second embodiment of the present application.

FIG. 9 shows the light-emitting device 40 of the second embodiment of the present application. The light-emitting device 40 in the second embodiment comprises a carrier 401, a light-emitting element 402, a first light guide layer 404, a low refractive index layer 405, and a wavelength conversion and light guide layer 420. The carrier 401, the light-emitting element 402, the first light guide layer 404, and the low refractive index layer 405 are the same as those in the first embodiment, and are not illustrated again.

The wavelength conversion and light guide layer 420 in this embodiment comprises a second light guide layer 416 and a wavelength conversion layer 413. The wavelength conversion layer 413 is formed on the outer surface of the second light guide layer 416. The second light guide layer 416 is a layer of material which enhances the light extraction efficiency. In more details, after the second light guide layer 416 is disposed on the light-emitting element 402, the light extraction efficiency is better than the one when the light-emitting element 402 is in direct contact with the air. In this embodiment, the second light guide layer 416 comprises a plurality of layers of material, and has a gradient refractive index (GRIN). Specifically, the second light guide layer 416 comprises a silicon oxynitride (SiON) layer and a silicon oxynitride (SiON) layer, and the refractive index is 1.95 and 1.7, respectively. Although a silicon oxynitride (SiON) layer and a silicon oxynitride (SiON) layer are used for the second light guide layer 416 in this embodiment, other materials may be used in other embodiments. For example, other materials may be glass (the refractive index is 1.5 to 1.9), resin (the refractive index is 1.5 to 1.6), diamond like carbon (DLC, the refractive index is 2.0 to 2.4), titanium oxide ($TiO_2$, the refraction index is 2.2 to 2.4), silicon oxide ($SiO_2$, the refractive index is 1.5 to 1.7) or magnesium fluoride (MgF, the refractive index is 1.38).

In this embodiment, the wavelength conversion layer 413 is a phosphor layer. The method to prepare the phosphor layer in this embodiment is mixing a yellow phosphor, such as YAG ($Y_3Al_5O_{12}$) or TAG ($Tb_3Al_5O_{12}$), with silicone with a refractive index of 1.45 to obtain the phosphor layer having a refractive index of 1.6.

[Third Embodiment]

Figure 10:
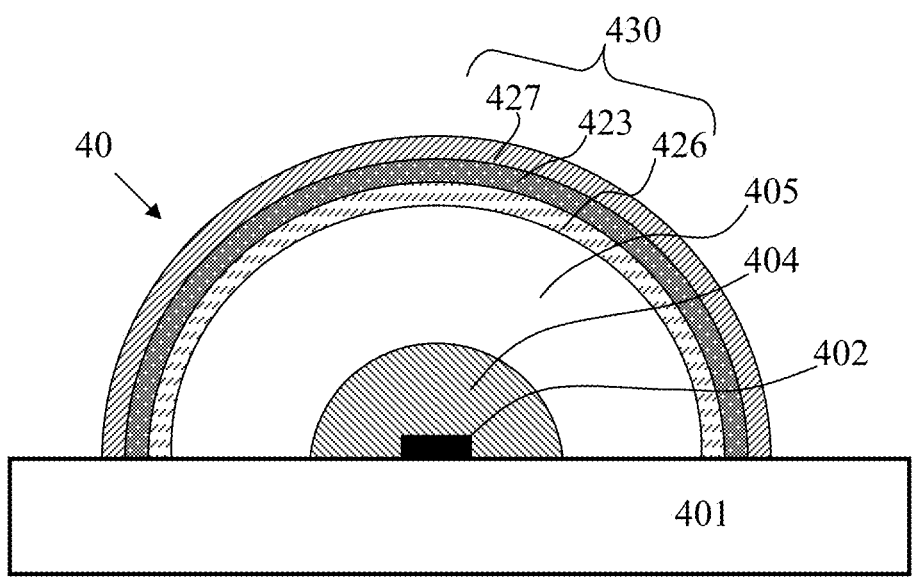
FIG. 10 illustrates the light-emitting device in accordance with the third embodiment of the present application.

FIG. 10 shows the light-emitting device 40 of the third embodiment of the present application. The light-emitting device 40 in the third embodiment comprises a carrier 401, a light-emitting element 402, a first light guide layer 404, a low refractive index layer 405, and a wavelength conversion and light guide layer 430. The carrier 401, the light-emitting element 402, the first light guide layer 404, and the low refractive index layer 405 are the same as those in the first embodiment, and are not illustrated again. The wavelength conversion and light guide layer 430 in this embodiment comprises a second light guide layer 426, a wavelength conversion layer 423, and a third light guide layer 427. The wavelength conversion layer 423 is formed between the second light guide layer 426 and the third light guide layer 427. The refractive index of the second light guide layer 426 is $n_i$, the refractive index of the wavelength conversion layer 423 is $n_j$, and the refractive index of third light guide layer 427 is $n_k$, wherein $n_i > n_j > n_k$. In other words, the wavelength conversion and light guide layer 430 in this embodiment has a gradient refractive index (GRIN).

The second light guide layer 426 and the third light guide layer 427 are layers of material which enhances the light extraction efficiency, respectively. In more details, after the second light guide layer 426 and/or the third light guide layer 427 is disposed on the light-emitting element 402, the light extraction efficiency is better than the one when the light-emitting element 402 is in direct contact with the air. In this embodiment, the second light guide layer 426 comprises a silicon nitride layer, and the refractive index is 1.95. The third light guide layer 427 is silicone, and the refractive index is 1.45. Although a silicon nitride layer is used for the second light guide layer 426 in this embodiment, other materials may be used in other embodiments. For example, other materials may be glass (the refractive index is 1.5 to 1.9), resin (the refractive index is 1.5 to 1.6), diamond like carbon (DLC, the refractive index is 2.0 to 2.4), titanium oxide ($TiO_2$, the refraction index is 2.2 to 2.4), silicon oxide ($SiO_2$, the refractive index is 1.5 to 1.7) or silicon oxynitride (the refractive index is 1.7).

In this embodiment, the value of refractive index of the wavelength conversion layer 423 is between those of the second light guide layer 426 and the third light guide layer 427. For example, the wavelength conversion layer 423 may be a phosphor layer formed by mixing a yellow phosphor with epoxy resin, and has a refractive index of 1.7.

In this embodiment, the third light guide layer 427 is silicon, but other materials may be used in other embodiments. For example, other materials may be glass (the refractive index is 1.5 to 1.9), resin (the refractive index is 1.5 to 1.6), titanium oxide ($TiO_2$, the refraction index is 2.2 to 2.4), silicon oxide ($SiO_2$, the refractive index is 1.5 to 1.7) or magnesium fluoride (MgF, the refractive index is 1.38).

[Fourth Embodiment]

Figure 11:
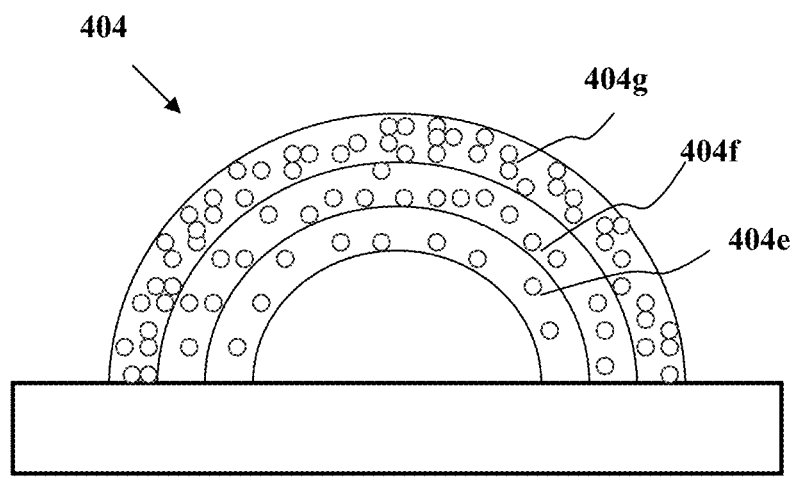
FIG. 11 illustrates the first light guide layer in accordance with the fourth embodiment of the present application.

FIG. 11 shows the first light guide layer 404 of the fourth embodiment of the present application. The difference between the fourth embodiment and the first embodiment is a porous material is used for forming the first light guide layer 404 and the second light guide layer 406, and the rest is the same as those in the first embodiment.

As shown in FIG. 11, the first light guide layer 404 comprises three layers: the first pore density layer 404e, the second pore density layer 404f, and the third pore density layer 404g, wherein the pore density of the first pore density layer 404e < the pore density of the second pore density layer 404f < the pore density of the third pore density layer 404g. That is, the first light guide layer 404 has a gradient pore density. As the lower the pore density is, the higher the refractive index is, the refractive index of the first pore density layer 404e > the refractive index of the second pore density layer 404f > the refractive index of the third pore density layer 404g. Therefore, the first light guide layer 404 has a gradient refractive index.

Similarly, the second light guide layer 406 in this embodiment may be a layer of material with various pore densities.

Specifically, the first light guide layer 404 in this embodiment is a porous titanium oxide layer with a gradient pore density. The method to form the porous titanium oxide layer is, for example, Glancing Angle Deposition (GLAD) method. The principle of GLAD method is that during the electron-beam evaporation process, the tilt angle of the carrier board is controlled, and thereby the incident angle of the vapor to the carrier board is controlled to grow a porous material. The porous material grown by this method is also named as a Nano-Rods material.

The vapor source used in this embodiment is, for example, titanium oxide ($Ti_3O_5$). The deposition process comprises three steps: the first step is to form the first pore density layer 404e with a lower pore density, the second step is to form the second pore density layer 404f with a higher pore density, and the third step is to form the third pore density layer 404g with a highest pore density. In the first step, the incident angle of the vapor (titanium oxide) is $\theta_e$ (not shown). In the second step, the incident angle of the vapor (titanium oxide) is $\theta_f$ (not shown). In the third step, the incident angle of the vapor (titanium oxide) is $\theta_g$ (not shown), wherein $\theta_e < \theta_f < \theta_g$. Formed by this method, the first pore density layer 404e is a porous titanium oxide layer with a refractive index n=1.9, the second pore density layer 404f is a porous titanium oxide layer with a refractive index n=1.7, and the third pore density layer 404g is a porous titanium oxide layer with a refractive index n=1.45.

Similarly, when a similar method described as the above is practiced with silicon oxide ($SiO_2$) as the vapor source, a porous silicon oxide layer with a gradient refractive index may be formed. In other embodiments, the first pore density layer 404e, the second pore density layer 404f, or the third pore density layer 404g may be a porous silicon oxide layer or other porous material layer.

It is noted that, as the porous silicon oxide layer formed by the GLAD method may have a lower refractive index, for example, n=1.05, which is close to the refractive index of air (n=1). Therefore, the low refractive index layer 405 in this embodiment may be a porous silicon oxide layer.

As the GLAD method is commonly used by a person of ordinary skill in the art of the present application, the details are not illustrated here.

[Fifth Embodiment]

Figure 12:
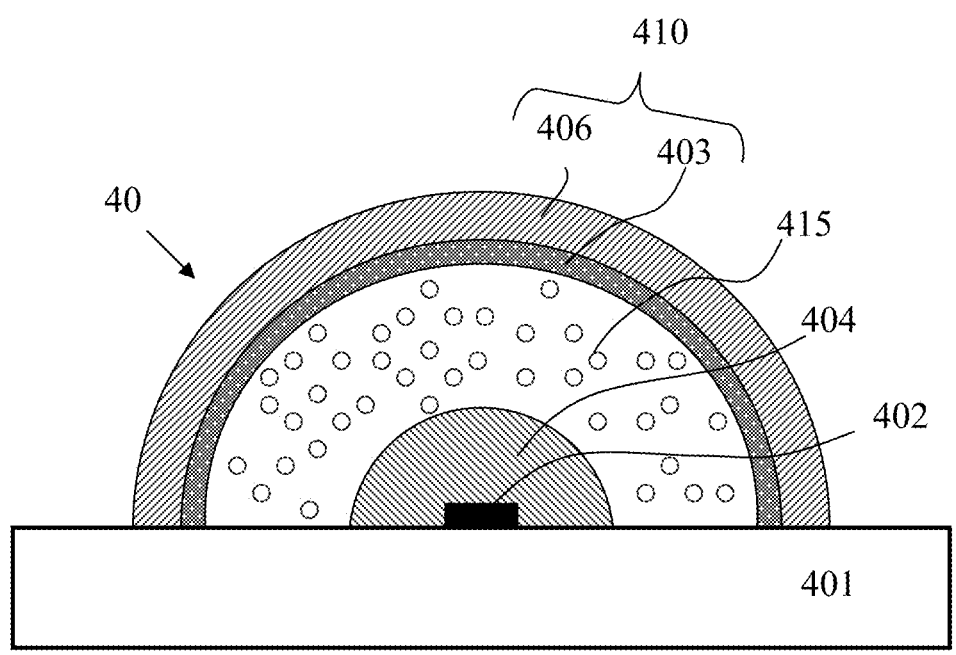
FIG. 12 illustrates the light-emitting device in accordance with fifth embodiment of the present application.

FIG. 12 shows the light-emitting device 40 of the fifth embodiment of the present application. The light-emitting device 40 in the fifth embodiment comprises a carrier 401, a light-emitting element 402, a first light guide layer 404, a low refractive index layer 415, and a wavelength conversion and light guide layer 410. The carrier 401, the light-emitting element 402, the first light guide layer 404, and the wavelength conversion and light guide layer 410 are the same as those in the first embodiment, and are not illustrated again. The low refractive index layer 415 in this embodiment comprises a layer of non-gas material, for example, a porous material layer. Specifically, the low refractive index layer 415 is a porous silicon oxide layer. The method to form the porous silicon oxide layer is, for example, a Sol-Gel method. The method is described in the following:

First, a precursor, a solvent, and a catalyst are prepared. The precursor is, for example, Tetraethoxysilane (TEOS). The solvent is, for example, Acetone. And the catalyst is, for example, Sodium Hydroxide. The TEOS is dissolved in Acetone, and water and Sodium Hydroxide are added and mixed to form a sol solution.

Then, stirring this sol solution until the sol solution becomes gel. This gel is siloxane formed by the TEOS after the hydrolysis and polymerization.

Afterwards, the siloxane gel is coated on the first light guide layer 404 (not shown), and after curing and heat treatment, a porous silicon oxide layer is formed on the first light guide layer 404. The porous silicon oxide layer has a low refractive index, for example, a refractive index of 1.2.

As shown in FIG. 12, the wavelength conversion and light guide layer 410 comprises a region which is in direct contact with the low refractive index layer 415 formed by this porous material layer. In this embodiment, this region is the wavelength conversion layer 403. The same as the first embodiment, the wavelength conversion layer 403 in this embodiment is, for example, a phosphor layer with a refractive index of 1.8. Because of the difference between the refractive index (1.8) of the phosphor layer and the refractive index (1.2) of the porous silicon oxide layer, when the light is propagated from the phosphor layer to the porous silicon oxide layer, most of the light is totally and internally reflected on the surface of the porous silicon oxide layer.

Although a porous silicon oxide layer is used for the porous material in this embodiment, other porous inorganic materials may be used in other embodiments. For example, other porous inorganic materials may be titanium dioxide, aluminum oxide, zinc oxide, zirconium oxide, tantalum oxide, tungsten oxide, tin oxide or magnesium oxide, etc.

Although TEOS is used for the precursors in this embodiment, other alkoxy monomers may be used in other embodiments. For example, other alkoxy monomers may be tetramethoxysilane, trimethoxymethylsilane, or dimethoxydimethylsilane.

Although sodium hydroxide is used for the catalyst in this embodiment, other acidic catalysts may be used in other embodiments. For example, other acidic catalysts may be hydrochloric acid, sulfuric acid or acetic acid, etc. Or other alkali catalysts, such as ammonia, pyridine, or potassium hydroxide, may be used for the catalyst.

As the Sol-Gel method is commonly used by a person of ordinary skill in the art of the present application, the details are not illustrated here.

[Sixth Embodiment]

Please refer to FIG. 4. In the first embodiment, the wavelength conversion layer 403 is a phosphor layer, and in this embodiment, the wavelength conversion layer 403 comprises a ceramic phosphor material. The advantage of the ceramic phosphor material is that the light scattering phenomenon can be reduced. A phosphor precursor is used in this embodiment to form ceramic phosphor material. The method is described in the following:

First, two solutions are prepared for preparing the phosphor (comprising cerium doped yttrium aluminum garnet, $Y_3Al_5O_{12}$:Ce, YAG:Ce) precursor. The first solution comprises a solution formed by the mixture of the yttrium chloride ($YCl_3 \cdot 6H_2O$), aluminum chloride ($AlCl_3 \cdot 6H_2O$), and cerium chloride ($CeCl_3 \cdot 7H_2O$). The second solution is an aqueous solution containing the reducing agent $NH_4HCO_3$. After these two solutions are mixed and placed in the reactor at a temperature of 60° C. to react, the phosphor precursor is formed.

Figure 13A:
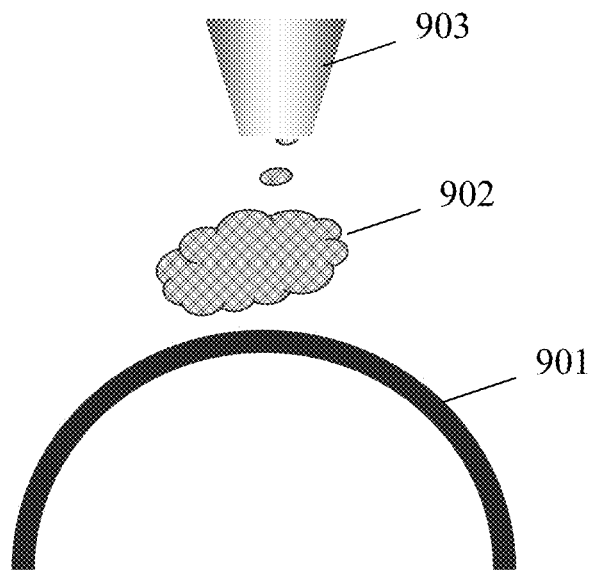
FIGS. 13A and 13B illustrate the forming method in accordance with the sixth embodiment of the present application.
Figure 13B:
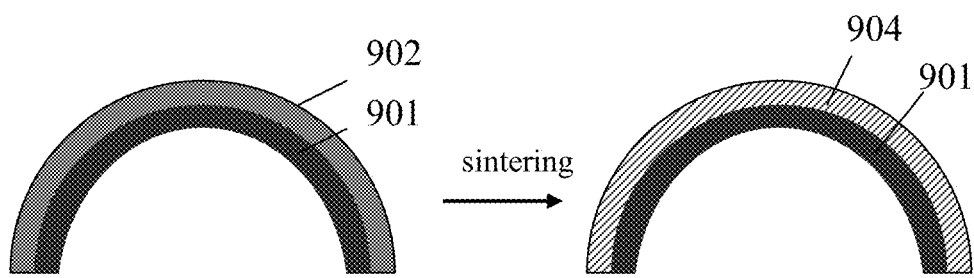

Please refer to FIG. 13A, the phosphor precursor 902 is then coated on a mold 901 by the spray coating devices 903. And as shown in FIG. 13B, after curing and sintering, the ceramic phosphor material 904 is formed. The material for the mold 901 may be aluminum oxide ($Al_2O_3$), zirconium dioxide ($ZrO_2$), or quartz.

After the ceramic phosphor material 904 is formed, the second light guide layer 406 is formed thereon to be used for the light-emitting device 40.

[Seventh Embodiment]

In this embodiment, a spray coating of a phosphor batter is used to form the ceramic phosphor material of the wavelength conversion layer 403.

First, the phosphor batter may be prepared by using a phosphor powder of mono-color, such as YAG phosphor, or a composition of phosphor powders of various colors. The size for the phosphor powder may be a scale of from nanometers to tens of microns.

Then, the phosphor powders, a binder, and solvent are mixed to form the phosphor batter. The binder may be, for example, silicone, spin on glass (SOG), or zinc oxide (ZnO). And the solvent may be, for example, acetone or toluene. After the phosphor batter is formed, the phosphor batter is disposed on a mold by a spray coating approach similar to the one as illustrated in FIG. 13A.

Then, following is a molding process at high temperature. After the mold is removed, the ceramic phosphor material is obtained. A ceramic phosphor material for the light of mono-color is obtained when a phosphor powder of mono-color is used. And a ceramic phosphor material for the light of at least two colors is obtained when phosphor powders of various colors are used and coated on different parts of the mold. After the ceramic phosphor material is formed, the second light guide layer 406 is formed thereon for the light-emitting device 40.

[Eighth Embodiment]

Figure 14:
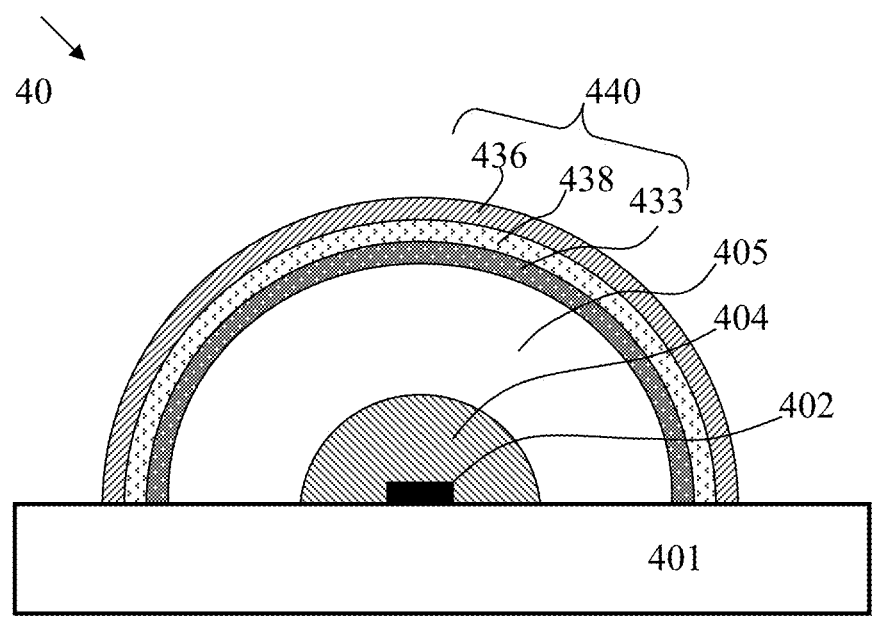
FIG. 14 illustrates the light-emitting device in accordance with the eighth embodiment of the present application.

FIG. 14 shows the light-emitting device 40 of the eighth embodiment of the present application. The light-emitting device 40 in the eighth embodiment comprises a carrier 401, a light-emitting element 402, a first light guide layer 404, a low refractive index layer 405, and a wavelength conversion and light guide layer 440. The carrier 401, the light-emitting element 402, the first light guide layer 404, and the low refractive index layer 405 are the same as those in the first embodiment, and are not illustrated again. The difference between the eighth embodiment and the first embodiment is the wavelength conversion and light guide layer 440. The wavelength conversion and light guide layer 440 in this embodiment comprises a wavelength conversion layer 433, a transparent conductive layer 438, and a second light guide layer 436. As shown in FIG. 14, the transparent conductive layer 438 is formed on the inner surface of the second light guide layer 436 in this embodiment, and the wavelength conversion layer 433 is formed on the inner surface of the transparent conductive layer 438. In other embodiments, the wavelength conversion layer 433 is formed on the outer surface of the transparent conductive layer 438, and the transparent conductive layer 438 is formed on the outer surface of the second light guide layer 436. The second light guide layer 436 is a layer of material which enhances the light extraction efficiency. In more details, after the second light guide layer 436 is disposed on the light-emitting element 402, the light extraction efficiency is better than that when the light-emitting element 402 is in direct contact with the air. Specifically, the second light guide layer 436 is glass, the wavelength conversion layer 433 is a yellow phosphor layer, and the transparent conductive layer 438 is metal oxide such as indium tin oxide (ITO). Although in this embodiment, the second light guide layer 436 is glass, in other embodiments, the second light guide layer 436 and the first light guide layer 404 may comprise other materials such as resin or other layer of material with gradient refractive index.

The method to form the transparent conductive layer 438 is, for example, a Sol-Gel method or a sputtering method. Taking the Sol-Gel method as an example, first, a glass mold is provided as the second light guide layer 436. And then a solution comprising the powder of ITO is coated on the glass mold by a Spin-On method. After curing and heat treatment, the transparent conductive layer 438 (ITO) is formed on the glass mold.

Figure 15:
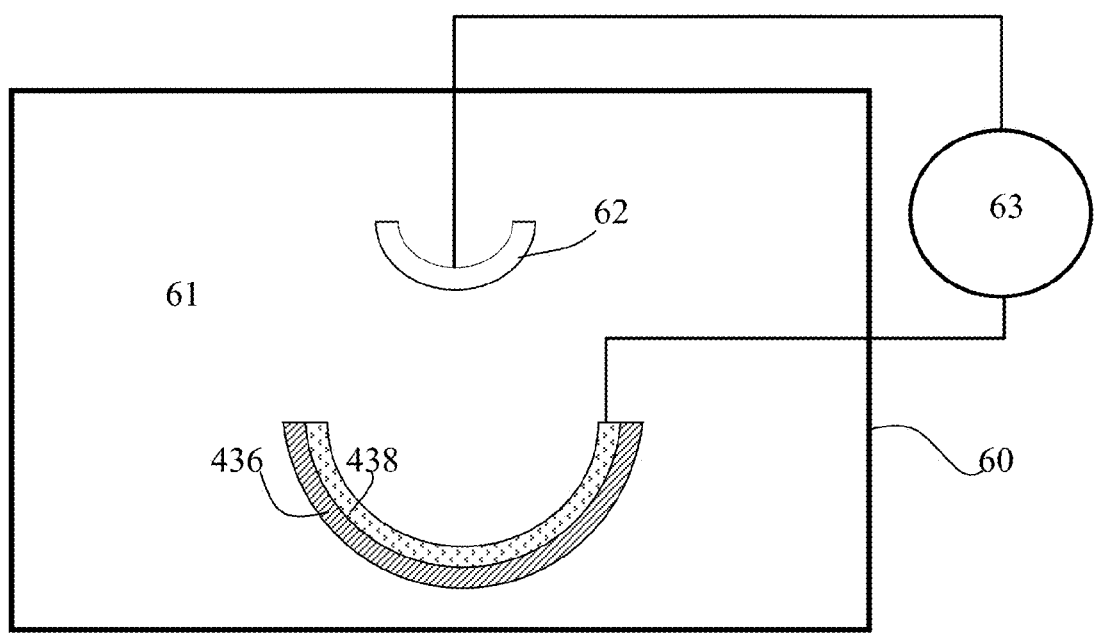
FIG. 15 illustrates the electrophoresis method in accordance with the eighth embodiment of the present application.

FIG. 15 shows the schematic diagram of the apparatus that performs the electrophoresis method for forming the wavelength conversion layer in above-mentioned embodiments. As shown in the figure, the apparatus comprises a reaction tank 60 such as an electrophoresis tank, the glass mold (as the second light guide layer 436) with the transparent conductive layer 438 formed thereon, the reaction solution 61 such as electrophoretic suspension, the electrode 62, and the power supply 63 which is electrically coupled to the transparent conductive layer 438 and the electrode 62.

Specifically, the reaction solution 61 in this embodiment is formed by isopropyl alcohol, water, magnesium nitrate, and YAG phosphor. Magnesium nitrate is added to provide magnesium ions ($Mg^{2+}$) to be adsorbed by the nonconductive surface of the YAG phosphor, and make the YAG phosphor positively charged. In other words, the reaction solution comprises the YAG phosphor particles with charged surfaces.

As a voltage is provided by the power supply 63, an electric field is formed between the electrode 62 and the transparent conductive layer 438. The electric field drives the YAG phosphor particles with charged surfaces to move toward and stack on the surface of the transparent conductive layer 438 to form a delicate phosphor layer. The phosphor layer formed is used as the wavelength conversion layer 433.

Although isopropyl alcohol is used as the solvent of the reaction solution 61 in this embodiment, other organic solvents may be used in other embodiments. And although magnesium nitrate is used as the electrolyte in this embodiment, other nitrates such as aluminum nitrate and sodium nitrate, or other materials such as metal salts, acids, and base compounds may be used in other embodiments.

With the transparent conductive layer 438 disposed on the wavelength conversion and light guide layer 440, the external voltage is able to be applied to the surface of the wavelength conversion and light guide layer 440. And accordingly, the electrophoresis method is able to be used for the formation of the phosphor layer.

The preferred embodiments of the light-emitting device of the present application are illustrated as the above, but the present application is not limited to the above embodiments. Other alternatives and modifications may be made by a person of ordinary skill in the art of the present application without escaping the spirit and scope of the application, and are within the scope of the present application.

What is claimed is:

1. A light-emitting device comprising:
    a carrier;
    a light-emitting element disposed on the carrier;
    a first light guide layer covering the light-emitting element;
    a second light guide layer covering the first light guide layer;
    a low refractive index layer between the first light guide layer and the second light guide layer to reflect the light from the second light guide layer;
    a wavelength conversion layer covering the second light guide layer; and a third light guide layer covering the wavelength conversion layer;

wherein the low refractive index layer has a refractive index smaller than one of the refractive indices of first light guide layer and the second light guide layer and wherein the refractive index of the second light guide layer is greater than that of the third light guide layer.

2. A light-emitting device comprising:

a carrier;

a light-emitting element disposed on the carrier;

a first light guide layer covering the light-emitting element;

a second light guide layer covering the first light guide layer;

a low refractive index layer between the first light guide layer and the second light guide layer to reflect the light from the second light guide layer; and a wavelength conversion layer covering the second light guide layer;

wherein the low refractive index layer has a refractive index smaller than one of the refractive indices of first light guide layer and the second light guide layer; and wherein the first light guide layer comprises a first plurality of layers each having a refractive index, and the refractive indices of the first plurality of layers are gradient arranged.

3. The light-emitting device as claimed in claim 1, wherein the low refractive index layer is porous.

4. The light-emitting device as claimed in claim 1, wherein the low refractive index layer comprises silicon oxide.

5. The light-emitting device as claimed in claim 1, wherein the low refractive index layer comprises air.

6. The light-emitting device as claimed in claim 1, wherein the first light guide layer is porous.

7. The light-emitting device as claimed in claim 5, wherein the second light guide layer comprises a second plurality of layers, wherein each of the second plurality of layers has a refractive index, and the refractive indices of the second plurality of layers are gradient arranged.

8. The light-emitting device as claimed in claim 1, wherein the second light guide layer is porous.

9. The light-emitting device as claimed in claim 1, wherein the second light guide layer comprises a dome shape structure.

10. The light-emitting device as claimed in claim 1, wherein shapes of the first light guide layer and the second light guide layer comprise hemisphere.

11. The light-emitting device as claimed in claim 1, wherein projections of the first light guide layer and the second light guide layer on the surface of carrier are circular or oval.

12. The light-emitting device as claimed in claim 1, wherein a diameter of the projection of the first light guide layer on the surface of the carrier is greater than or equal to 2.5 times of a length of the light-emitting element.

13. The light-emitting device as claimed in claim 1, wherein a diameter of the projection of the second light guide layer on the surface of the carrier is greater than or equal to 2 times of a diameter of the projection of the first light guide layer on the surface of the carrier.

14. The light-emitting device as claimed in claim 1, wherein the wavelength conversion layer comprises a ceramic phosphor material.

15. A light-emitting device comprising:

a carrier;

a light-emitting element disposed on the carrier;

a first light guide layer covering the light-emitting element;

a second light guide layer covering the first light guide layer;

a low refractive index layer between the first light guide layer and the second light guide layer to reflect the light from the second light guide layer;

a wavelength conversion layer covering the second light guide layer; and a third light guide layer covering the wavelength conversion layer;

wherein the low refractive index layer has a refractive index smaller than one of the refractive indices of first light guide layer and the second light guide layer; and wherein the wavelength conversion layer comprises a phosphor layer formed by mixing a phosphor with epoxy resin.

16. The light-emitting device as claimed in claim 1, wherein shapes of the first light guide layer and the second light guide layer are the same.

17. The light-emitting device as claimed in claim 1, wherein the refractive index of the wavelength conversion layer is between that of the first light guide layer and that of the second light guide layer.

18. The light-emitting device as claimed in claim 1, wherein the second light guide layer comprises silicon nitride, glass, diamond like carbon, titanium oxide, silicon oxide or silicon oxynitride.

* * * * *